United States Patent [19]

Sandhu et al.

[11] Patent Number: 5,504,831
[45] Date of Patent: Apr. 2, 1996

[54] SYSTEM FOR COMPENSATING AGAINST WAFER EDGE HEAT LOSS IN RAPID THERMAL PROCESSING

[75] Inventors: Gurtej S. Sandhu; Randhir P. S. Thakur, both of Boise, Id.

[73] Assignee: Micron Semiconductor, Inc., Boise, Id.

[21] Appl. No.: 149,855

[22] Filed: Nov. 10, 1993

[51] Int. Cl.$^6$ .......................... H01L 21/205; H05B 3/00
[52] U.S. Cl. .................. 392/418; 392/416; 392/411; 392/440; 362/327; 250/504 R; 118/724
[58] Field of Search .................... 392/418, 416, 392/411, 408, 440, 422–424; 219/405, 411, 85.12, 85.13; 362/328, 327, 308, 277, 257; 250/492.2, 492.22, 504 R; 359/727, 732, 354–356, 615; 118/724, 725, 50.1; 427/521, 542, 557

[56] References Cited

U.S. PATENT DOCUMENTS

| | | | |
|---|---|---|---|
| 3,044,357 | 7/1962 | Linke | 359/732 |
| 4,398,094 | 8/1983 | Hiramoto | 250/492.1 |
| 4,755,654 | 7/1988 | Crowley et al. | 219/405 |
| 4,960,972 | 10/1990 | Nakamura et al. | 219/85.12 |
| 4,972,302 | 11/1990 | Masuyama et al. | 362/327 |
| 5,068,768 | 11/1991 | Kobayashi | 362/277 |
| 5,138,540 | 8/1992 | Kobayashi et al. | 362/277 |

FOREIGN PATENT DOCUMENTS

| | | |
|---|---|---|
| 55-110832 | 8/1980 | Japan . |
| 60-16416 | 1/1985 | Japan . |
| 60-161616 | 8/1985 | Japan . |
| 1-115118 | 5/1989 | Japan . |
| 1-164793 | 6/1989 | Japan . |

*Primary Examiner*—John A. Jeffery
*Attorney, Agent, or Firm*—David J. Paul

[57] ABSTRACT

A method for compensating against wafer edge heat loss during rapid thermal processing includes a semiconductor wafer that is exposed to uniform radiant energy across the entire wafer surface. The wafer is exposed by projecting a radiant energy image onto the edge of said semiconductor wafer while providing radiant energy rays directly to the wafer's surface. The radiant energy image comprises reflecting radiant energy rays that pass through a positionally adjustable object onto the edge of the wafer. The positionally adjustable object is optional and is mounted between an optical lens and a radiant energy source or is mounted between a reflector and each radiant energy source (A second optical lens is optional). The energy rays absorbed at the edge of the wafer contain more heat intensity than do the rays which are absorbed by the inner portion of the wafer, thus producing uniform heat across the entire wafer. The system may also have at least one radiant energy source suspended over the wafer, a reflector mounted behind each radiant energy source, a reflector mounted behind the positionally adjustable optical lens. The optical lens may be a concave lens having its concave surface facing either towards the reflector or towards the wafer. The radiant source uses a single heating lamp or multiple heating lamps having a heat emitting element affixed inside each heating lamp (each heating lamp may have a reflective coating directly behind a each affixed heat emitting element).

36 Claims, 4 Drawing Sheets

SYSTEM FOR COMPENSATING AGAINST WAFER EDGE HEAT LOSS IN RAPID THERMAL PROCESSING

FIELD OF THE INVENTION

This invention relates to incoherent light based thermal processing, and more particularly, a system for compensating against wafer edge heat loss during thermal processing.

BACKGROUND OF THE INVENTION

In the fabrication of semiconductor wafers, one recurring problem has been temperature measurement and control. When processing a semiconductor substrate, the temperature of the two sides of the substrate being processed is of critical importance. Overheating can cause dopants to permeate subjacent layers, and under-heating can produces layers which are unreliable and subject to lower tolerances. In order to promote desired photo assisted and chemical reactions and suppress unwanted phenomena, several solutions have been put forth to gauge the substrate's temperature to avoid overheating and under-heating, and thus provide optimized ramp up, steady state and/or ramp down cycle. While the temperature measurement techniques lack precision, wafer temperature non-uniformity during transient Rapid Thermal Processing (RTP) and plasma processing also are issues of concern.

The known solutions to control wafer temperature non-uniformity include rotating the substrate during heating, adjusting different lamps individually, or having the lamps in different zones.

FIGS. 1(a) and (b) illustrate the temperature variation of a semiconductor wafer undergoing during thermal processing. FIG. 1(a) demonstrates the heat radiation, generated from heat lamp 11 which reflects off of reflector lens 12 onto a wafer substrate 13. Rings 14 and 15 at the edges of substrate 13 correlate to the heat absorbing curve depicted in FIG. 1(b).

As FIG. 1(b) shows, the temperature measured at the edge of the wafer (rings 14 and 15) is either increasing or decreasing in temperature and therefore the temperature is not evenly distributed across from the inner portion 16 to the edge of wafer substrate 13. Moreover, the temperature uniformity for patterned wafers, wafers with different films having different thermal expansion coefficients, are going to be even more difficult to control as far as the temperature issue is concerned. Non-uniformity becomes even a bigger factor when the wafer size is larger, thus allowing the disadvantage of, greater heat edge loss at the wafer's edge, and greater temperature variation from the center of the wafer to its edge.

It is therefore desired, during an RTP process, to heat a semiconductor wafer in such a manner as to provide for the wafer's edges to be heated and maintained at a uniform temperature that is substantially the same as the temperature distributed across the inner wafer portion.

SUMMARY OF THE INVENTION

A primary advantage of the present invention is to eliminate the aforementioned drawbacks of the prior art.

A system for compensating against wafer edge heat loss during thermal processing uses means for exposing the wafer to radiant energy uniformly across the wafer. Means for exposing the wafer has at least one radiant energy source suspended over the wafer, a reflector mounted behind each radiant energy source, and a positionally adjustable optical lens mounted between the reflector and each radiant energy source.

Other aspects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1A:
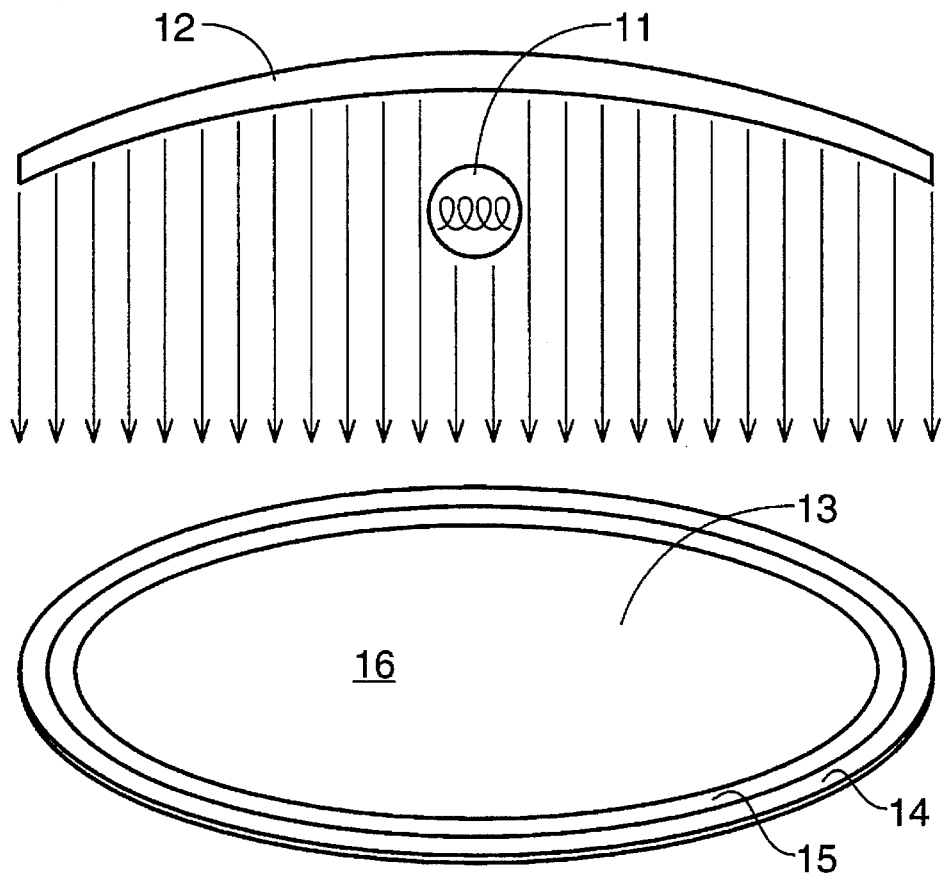
FIGS. 1(a) and (b) illustrate the temperature variation of a semiconductor wafer undergoing thermal processing.
Figure 1B:
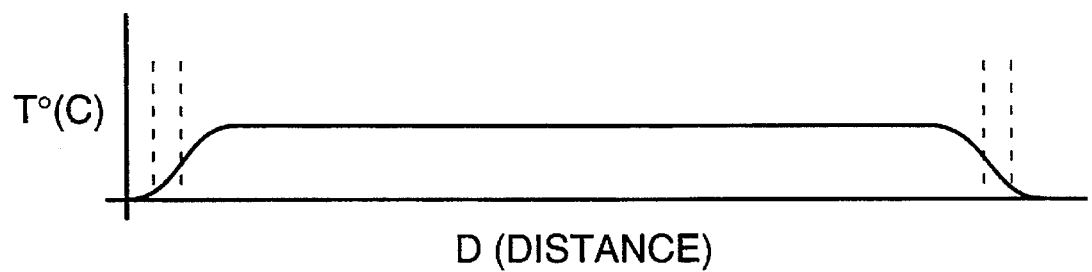
Figure 2:
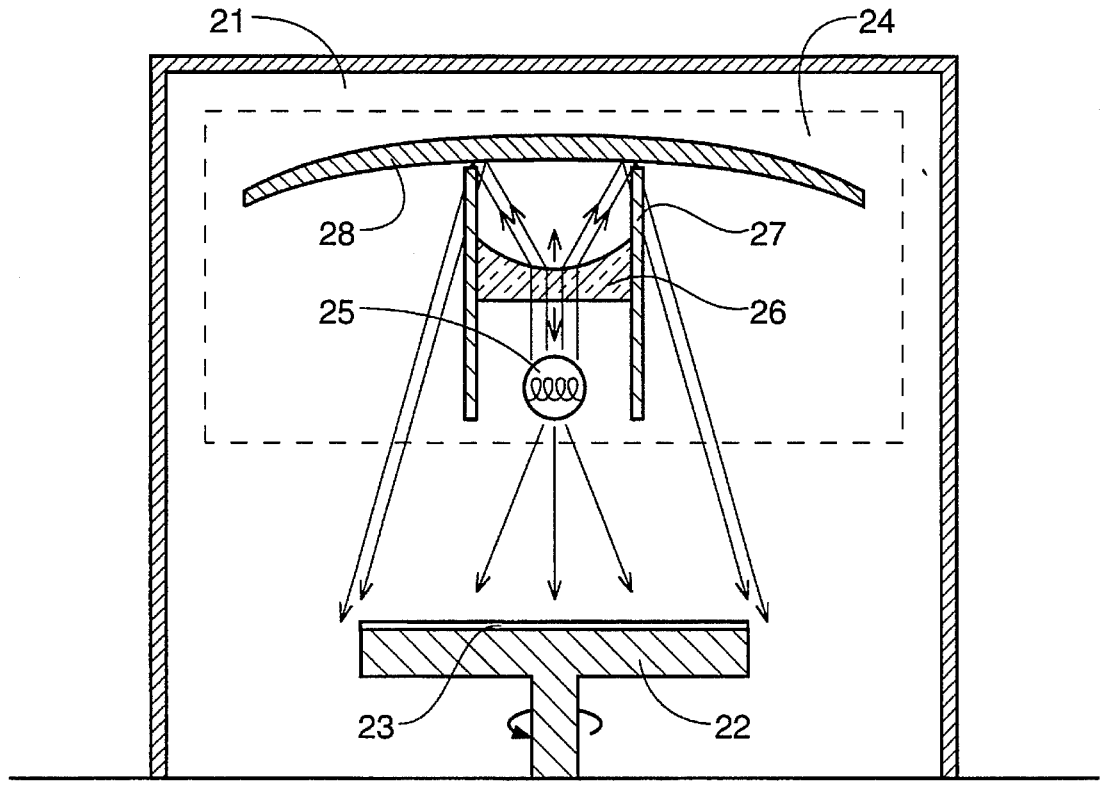
FIG. 2 is a first embodiment of the present invention.
Figure 3:
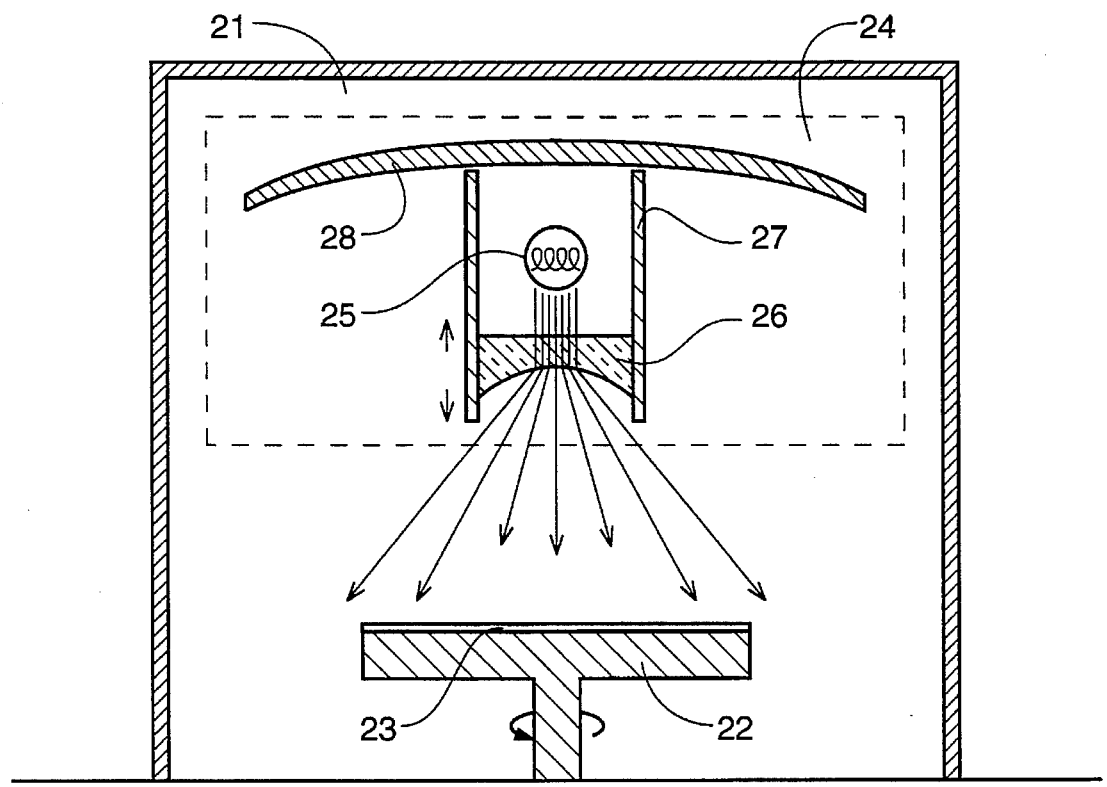
FIG. 3 is a second embodiment of the present invention.
Figure 4A:
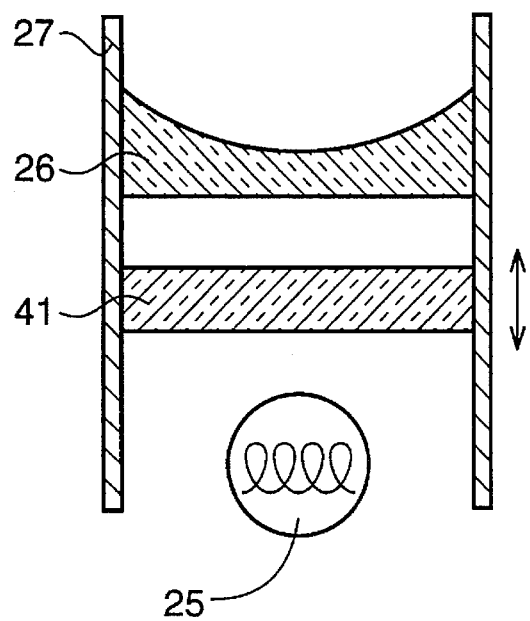
FIGS. 4(a) and (b) illustrate a third embodiment of the present invention.
Figure 4B:
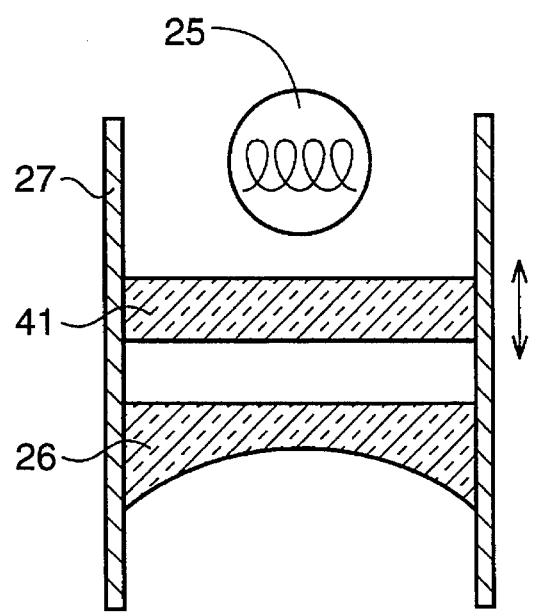

The present invention is described in three embodiments, with a first embodiment depicted in FIG. 2, a second embodiment depicted in FIG. 3 and a third embodiment depicted in FIGS. 4a and 4b.

Referring now to FIG. 2, a process chamber 21 and in particular an RTP process chamber is depicted. The external connecting apparatus is not shown as process equipment, such as RTP process equipment, is known to those skilled in the art. Inside process chamber 21 resides a wafer mounting chuck 22 holding a semiconductor wafer 23. (It is optional to have a rotating wafer mounting chuck 22.) A radiant energy source 24 is made up of a lamp 25 and an optic lens 26, both of which are attached to reflector 28 by mounting bracket 27. The optic lens 26 is a concave lens that is mounted between reflector 28 and lamp 25 and the concave surface of lens 26 is facing toward reflector 28. The radiant energy from lamp 25 not only penetrates the wafer's upper surface directly, but also sends heat rays that diverge through lens 26 and reflect back to wafer 23 via reflector 28, which for simplicity sake is called secondary heating. The selection of the size and position of lens 26 can be furnished by simple optic calculations such that the reflected divergent rays penetrate only the edge of wafer 23. From wafer temperature measuring techniques, known to those skilled in the art, the required wafer edge surface area needing secondary heating can be determined. It is also important to note that the position of lens 26 is variable so that the optimum secondary heat may be generated during the process (in-situ) by moving lens 26 in one direction or the other to change the size and intensity of the projected image which will produce the desired secondary radiant energy at the wafer's edge.

The system in FIG. 3 accomplishes the same basic goal as does the system of FIG. 2, which is to provide additional radiant energy to the wafer's edge. In FIG. 3, the optic lens 26 is still a concave lens but now the lamp 25 is mounted between reflector 28 and lens 26 and the concave surface of lens 26 is facing towards wafer 23. The radiant energy rays from lamp 25 diverge through lens 26 and thus penetrate the wafer at a divergent angle that in effect provides a higher radiant energy at the edges of the wafer than towards the inner surface. As is the case for FIG. 2, the selection of the size and position of lens 26 can be furnished by simple optic calculations such that the divergent rays penetrate the edge of wafer 23 at an intensity that causes the wafer's edges to be heated (and maintained) to the same temperature as is the inner portion of the wafer. It is also important to note that the position of lens 26 is variable so that the optimum secondary heat may be generated during the process (in-situ) by moving lens 26 in one direction or the other to change the size and intensity of the radiant energy across the entire wafer and particularly at the wafer's edge.

FIGS. 4(a) and 4(b) represent variations to the system depicted in FIGS. 2 and 3, respectively. In each case an additional object 41 (i.e. an optic lens) is placed between the lamp 25 and the concave lens 26. The position of object 41 is variable in that it can slide either closer to lamp 25 or closer to lens 26. By varying the position of object 41 the size and intensity of the radiant energy rays can be adjusted. This allows adjustments to be made during (in-situ) the RTP process that allows optimal heating of the wafer's edge.

Figure 5A:
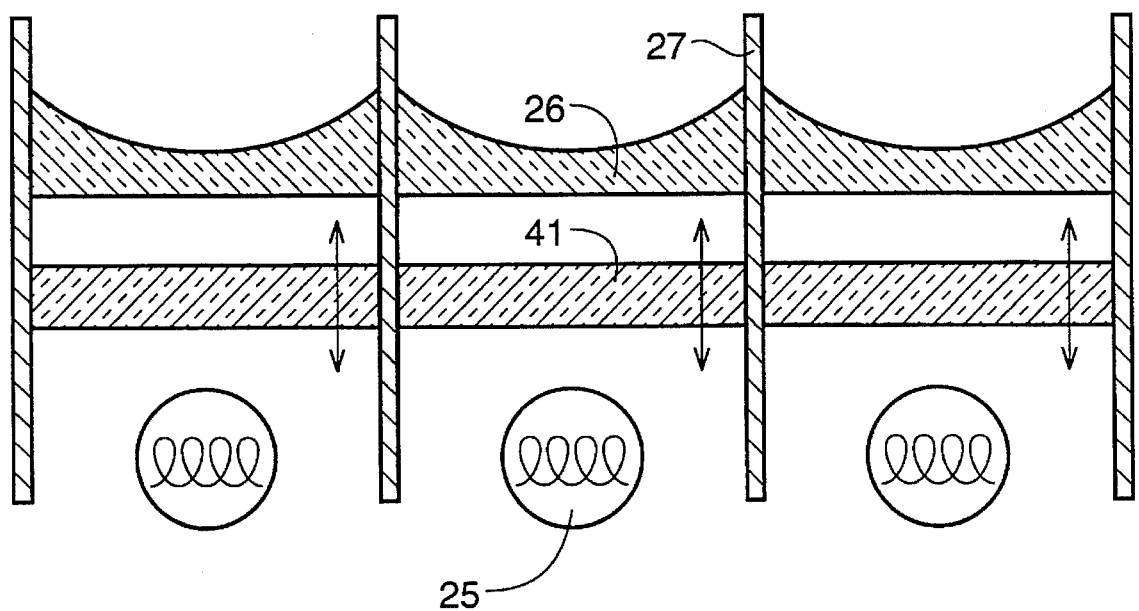
FIGS. 5(a) and (b) illustrate a third embodiment of the present invention.
Figure 5B:
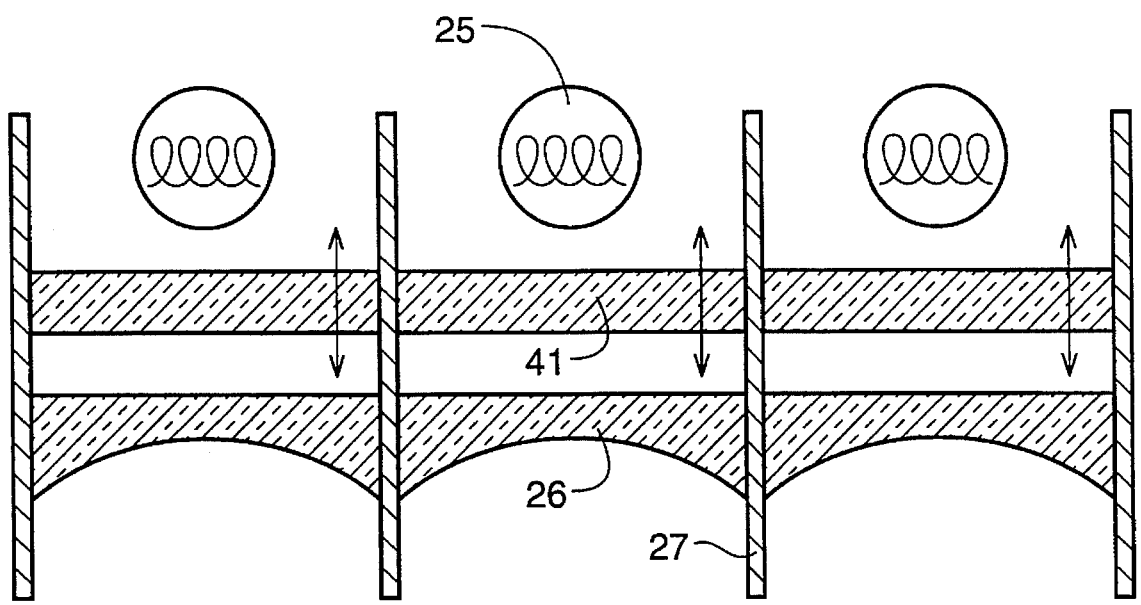

FIGS. 5(a) and 5(b) also represent variations to the system depicted in FIGS. 2 and 3, respectively. In each case multiple lights are present that are each set up with individual optics. This arrangement allows individual control of the radiant energy directed to the wafer. As in FIGS. 4(a) and 4(b) each lamp has an additional object 41 (i.e. an optic lens) that is placed between the lamp 25 and the concave lens 26. The position of object 41 is variable in that it can slide either closer to lamp 25 or closer to lens 26. By varying the position of object 41 the size and intensity of the radiant energy rays can be adjusted. This allows adjustments to be made during (in-situ) the RTP process that allows optimal heating of the wafer's edge. The multiple lamps may be set up as in FIGS. 2 and 3, or they may be set up as in FIGS. 4(a) and 4(b). Also, a variation of both approaches may be used in order to obtain the necessary energy desired.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

What is claimed is:

1. A system for compensating against wafer edge heat loss during thermal processing comprising:

at least one radiant energy source;

a reflector mounted behind each radiant energy source; and a positionally adjustable optical lens mounted between said reflector and each said radiant energy source.

2. The system of claim 1 wherein said radiant energy source and said reflector comprise a heating lamp having a reflective coating directly behind a heat emitting element affixed inside said heating lamp.

3. The system of claim 1 wherein said radiant energy source comprises multiple heating lamps.

4. The system of claim 1 wherein said optical lens comprises a concave lens having its concave surface facing towards said reflector.

5. The system of claim 1 further comprising a positionally adjustable object mounted between said optical lens and said radiant energy source.

6. The system of claim 5 wherein said positionally adjustable object comprises a second optical lens.

7. The system of claim 6 wherein said radiant energy source and said reflector comprises a heating lamp having a heat emitting element affixed inside said heating lamp.

8. The system of claim 7 wherein said radiant energy source comprises multiple heating lamps having heat emitting elements affixed inside each said heating lamp.

9. The system of claim 6 wherein said optical lens comprises a concave lens having its concave surface facing towards said said radiant energy source.

10. The system of claim 5 wherein said positionally adjustable object comprises a second optical lens.

11. The system of claim 1 further comprising a positionally adjustable object mounted between said optical lens and said radiant energy source.

12. The system of claim 1 wherein said system is encompassed by a chamber.

13. The system of claim 12 wherein said chamber contains a wafer.

14. The system of claim 12 wherein said chamber is a rapid thermal processing chamber.

15. A system for compensating against wafer edge heat loss during plasma processing comprising:

at least one radiant energy source;

a reflector mounted behind said radiant energy source; and a positionally adjustable optical lens mounted between said reflector and each said radiant energy source.

16. The system of claim 15 wherein said radiant energy source and said reflector comprise a heating lamp having a reflective coating directly behind a heat emitting element affixed inside said heating lamp.

17. The system of claim 16 wherein said optical lens comprises a concave lens having its concave surface facing towards said reflector.

18. The system of claim 15 further comprising a positionally adjustable object mounted between said optical lens and said radiant energy source.

19. The system of claim 18 wherein said positionally adjustable object comprises a second optical lens.

20. The system of claim 15 further comprising a positionally adjustable object mounted between said optical lens and said radiant energy source.

21. The system of claim 15 wherein said system is encompassed by a chamber.

22. The system of claim 21 wherein said chamber contains a wafer.

23. The system of claim 21 wherein said chamber is a rapid thermal processing chamber.

24. A chambered system for compensating against wafer edge heat loss during processing of a wafer, said chambered system comprising:

at least one radiant energy source suspended over said wafer;

a reflector mounted behind said radiant energy source; and a positionally adjustable optical lens mounted between said reflector and each said radiant energy source.

25. The system of claim 24 wherein said radiant energy source and said reflector comprise a heating lamp having a reflective coating directly behind a heat emitting element affixed inside said heating lamp.

26. The system of claim 25 wherein said radiant energy source comprises multiple heating lamps.

27. The system of claim 25 wherein said optical lens comprises a concave lens having its concave surface facing towards said reflector.

28. The system of claim 25 further comprising a positionally adjustable object mounted between said optical lens and said radiant energy source.

29. The system of claim 28 wherein said positionally adjustable object comprises a second optical lens.

30. The system of claim 28 wherein said radiant energy source and said reflector comprises a heating lamp having a heat emitting element affixed inside said heating lamp.

31. The system of claim 30 wherein said radiant energy source comprises multiple heating lamps having heat emitting elements affixed inside each said heating lamp.

32. The system of claim 28 wherein said optical lens comprises a concave lens having its concave surface facing towards said wafer.

33. The system of claim 28 wherein said positionally adjustable object comprises a second optical lens.

34. The system of claim 24 further comprising a positionally adjustable object mounted between said optical lens and said radiant energy source.

35. The chambered system of claim 24 wherein said chamber is a rapid thermal processing chamber.

36. The chambered system of claim 24 wherein said chamber is plasma enhanced.

* * * * *